Figure 1:
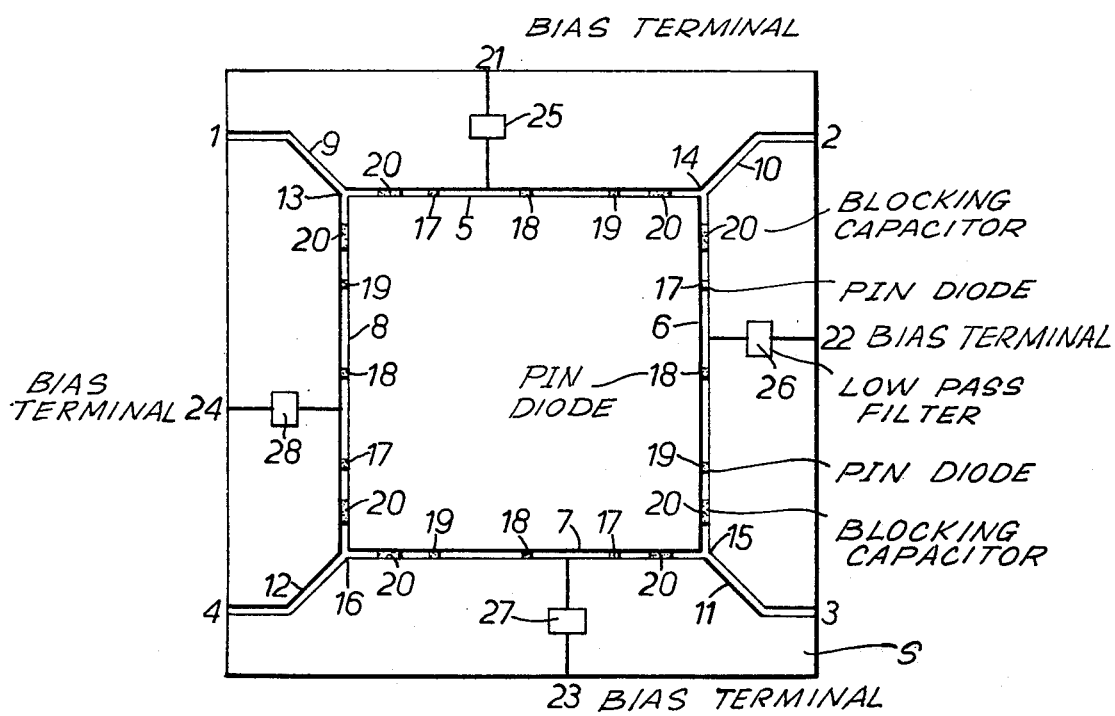

United States Patent [19]
Wallington et al.

[11] 3,982,212
[45] Sept. 21, 1976

[54] SWITCHING ARRANGEMENTS

[75] Inventors: John Richard Wallington, London; John Graham Richings, Burnham-on-Crouch, both of England

[73] Assignee: The Marconi Company Limited, Chelmsford, England

[22] Filed: May 2, 1975

[21] Appl. No.: 573,981

[30] Foreign Application Priority Data
June 14, 1974 United Kingdom............ 26414/74

[52] U.S. Cl. .............................. 333/7 D; 333/97 S
[51] Int. Cl.² ............................................ H01P 1/15
[58] Field of Search ........................ 333/7 D, 1.1; 340/166 R

[56] References Cited
UNITED STATES PATENTS

| | | |
|---|---|---|
| 3,305,797 | 2/1967 | Clavin .................................. 333/1.1 |
| 3,626,208 | 12/1971 | Cooney ........................ 333/7 D UX |
| 3,678,414 | 7/1972 | Hallford .............................. 333/7 D |
| 3,774,123 | 11/1973 | Hume .................................. 333/7 D |
| 3,833,866 | 9/1974 | Boutelant .............................. 333/7 D |

FOREIGN PATENTS OR APPLICATIONS
1,479,516  3/1967  France .................................. 333/7 D Primary Examiner—Paul L. Gensler
Attorney, Agent, or Firm—Baldwin, Wight & Brown

[57] ABSTRACT

A switching arrangement for use at very high frequencies (gigahertz) consists of a number of four port microstrip switches interconnected to provide a versatile routing matrix. The use of P.I.N. diodes in each switch provides low insertion loss and also high isolation between different routes. The arrangement can be made in a very compact form.

4 Claims, 4 Drawing Figures

SWITCHING ARRANGEMENTS

This invention relates to switching arrangements which are suitable for providing a routing function for very high frequency electrical signals, typically of the order of gigahertz.

According to this invention a switching arrangement comprises a plurality of switching devices, each switching device having four ports each of which is connected to two of the remaining three ports by a microstrip, each microstrip including a variable impedance P.I.N. diode positioned a quarter wavelength (or an odd multiple thereof) from a junction with one of the other microstrips, the plurality of switching devices being interconnected together to form a switching matrix having a plurality of selectable routes or signal paths therethrough.

A switching arrangement in accordance with this invention is intended to be used for switching a restricted band of frequencies, the centre frequency of which determines the quarter wavelength positioning of the P.I.N. diode from said junction.

The lengths of each of the four microstrips are preferably equal. Although each of said microstrips may contain only a single P.I.N. diode, preferably each microstrip contains a plurality of P.I.N. diodes. Where each of said microstrips contains a single P.I.N. diode, is overall electrical length is preferably a half wavelength. Where a plurality of P.I.N. diodes are included in each microstrip, preferably they are spaced apart from one another by a quarter wavelength. Preferably each microstrip contains three P.I.N. diodes arranged such that its overall electrical length is equal to one wavelength.

The impedance of a P.I.N. diode may be altered between a low value and a high value by means of an appropriate d.c. bias applied to it. To permit independent operation of the P.I.N. diode (or diodes as the case may be) in each microstrip, d.c. isolation must be provided between them. This may conveniently be achieved by bridging with a capacitor a small break between each junction of a pair of adjacent microstrips and the P.I.N. diodes nearest to the junctions.

Preferably the mounting point for each P.I.N. diode consists of a localised narrow neck of microstrip conductor with the diode displaced slightly to one side of the centre-line of the microstrips.

Conveniently, in a switching matrix an even number of four port switching devices are provided, half of which are mounted on one alumina substrate, and half on another alumina substrate, the two substrates being positioned back-to-back and separated by an air gap.

This results in a relatively compact switching arrangement which is capable of providing a large number of different selectable routes for signals of very high frequencies.

Thus, for example, a switching matrix could consist of six devices interconnected to provide up to 24 different combinations of routes between four inputs and four outputs. If a lesser number of combinations are required, the switching matrix contains a degree of built-in redundancy which can be used to provide unimpaired operation in the event of a failure of one of the microstrips, or its associated P.I.N. diodes, in a switching device.

Figure 2:
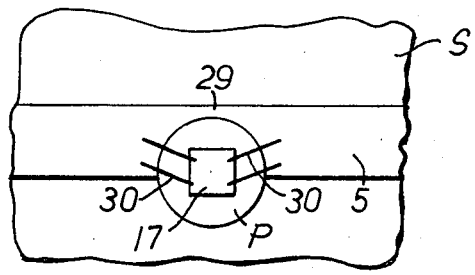
Figure 3:
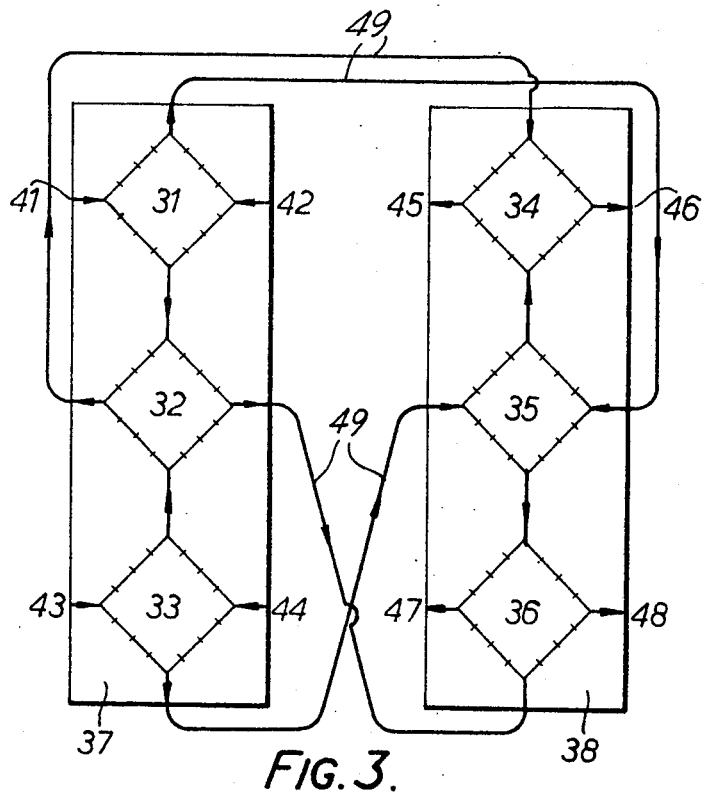
Figure 4:
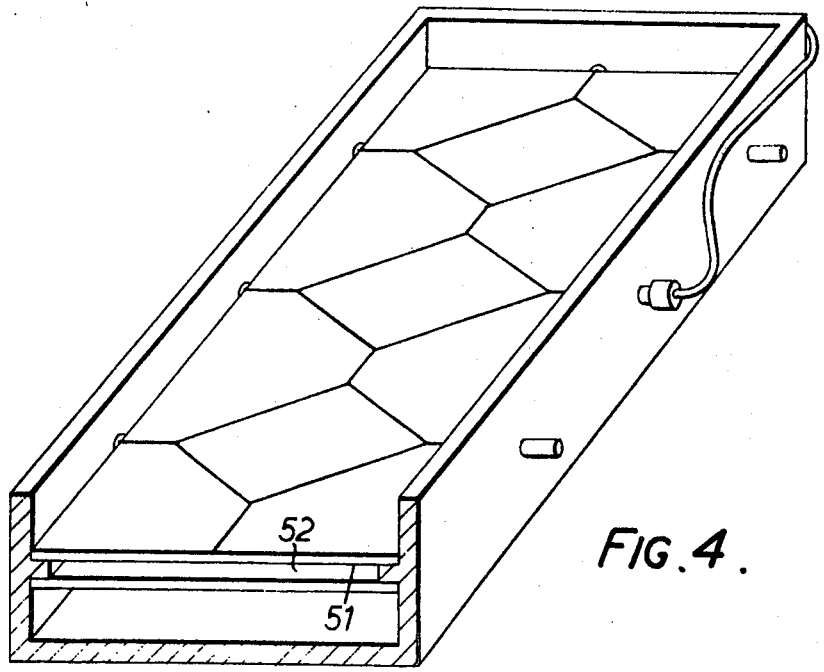

The invention is further described, by way of example, with reference to the accompanying drawings in which;

FIG. 1 illustrates part of a switching arrangement in accordance with the present invention and which consists of a single four port switching device, FIG. 2 illustrates a detail thereof, showing part of the mounting arrangement for a P.I.N. diode, FIG. 3 illustrates diagrammatically a switching arrangement consisting of six of the switching devices shown in FIG. 1, and FIG. 4 shows, in a simplified form a practical configuration for the switching arrangement illustrated in FIG. 3.

Referring to FIG. 1, the switching arrangement shown therein possesses four ports 1, 2, 3 and 4 which are interconnected by four microstrips 5, 6, 7 and 8 as shown. Four short additional lengths of microstrip 9, 10, 11 and 12 link the ports 1, 2, 3 and 4 respectively with microstrip junction points 13, 14, 15 and 16. Each microstrip 5, 6, 7 and 8 is provided with three P.I.N. diodes 17, 18 and 19 spaced a quarter-wavelength apart from each other. Diodes 17 and 19 are spaced a quarter wavelength from the adjacent junction points 13, 14, 15 and 16 such that the electrical length of each microstrip 5, 6, 7 and 8 is equal to one wavelength.

The magnitude of the wavelength referred to above is the centre frequency of the frequency band at which the switching arrangement is designed to be used. In the example under consideration the operating band extends from about 3 GHz to 4½ GHz, which means that the quarter wavelength spacing between adjacent P.I.N. diodes is about 8 millimeters. The P.I.N. diodes themselves are about 15 thousandths of an inch square in section. The microstrips are mounted on a substrate S of alumina which is about 25 thousandths of an inch thick, and which is backed by an electrically conductive ground plane P. As is known, the width of the microstrip conductor is dimensioned in relation to the thickness and permitivity of the substrate to give a predetermined characteristic impedance, typically 50 ohms, at the operating frequency.

Towards both ends of the microstrips 5, 6, 7 and 8 a small chip capacitor 20 is positioned across a small break or discontinuity in the microstrip conductor to provide d.c. isolation for the three diodes on each microstrip. This permits the four groups of diodes to be operated independently. P.I.N diodes possess the property that with suitable selection of d.c. biasing their impedance can be controllably switched between a very high value and a very low value. For example, the low value may be of the order of 1 or 2 ohms or even less. The bias for the P.I.N. diodes is provided via the terminals 21, 22, 23 and 24 which are decoupled from the high frequencies carried by the microstrips 5, 6 7 and 8 by low pass filters 25, 26, 27 and 28.

By biasing the P.I.N. diodes present in microstrips 5 and 7 so that they adopt their low impedance state and thus short circuit the microstrip conductors at those points to the ground plane P, a very high impedance is presented by microstrips 5 and 7 to input signals present at, say ports 1 and 3. By simultaneously arranging that the P.I.N. diodes in microstrips 6 and 8 adopt their high impedance value, (so that microstrips 6 and 8 present a low impedance to the input signals at ports 1 and 3) the input signals are passed to output ports 2 and 4 with little insertion loss. On the other hand the isolation provided between port 1 and port 2, and between port 3 and port 4 is very high e.g. say 60 dB or more.

Although a similar effect is obtained if only a single P.I.N. diode is provided in each microstrip (in this case the length of each microstrip would preferably be only a half wavelength) the isolation is significantly less.

By controlling the P.I.N. diodes, therefore, high frequency signals may be routed through the switching arrangement as desired.

FIG. 2 shows a detail of the microstrip 5 in the region of the P.I.N. diode 17. By way of example, microstrip 5 and P.I.N. diode 17 are referred to, although the mounting arrangement for all diodes is similar. The substrate S is provided with an opening which exposes the underlying ground plane P so that the width of the conductors is reduced to a very narrow neck 29 in the region of the diode 17, but no break in the continuity of the conductors is provided. This configuration provides a smaller insertion loss than would be the case if no reduction in the width of the conductor were provided and the diode 17 were necessarily considerably displaced to one side of the conductors. On the other hand a greater reliability is achieved with the present configuration than would be the case if a total discontinuity was made in the conductor to allow the diode to be aligned with the centre of the conductor, since in such a case if the bonded leads 30 becomes open circuited that microstrip 5 would become inoperative. With the present configuration both disadvantages are avoided. The diode 17 is mounted directly on the ground plane P with one electrode connected thereto whereas the other electrode of the diode is connected by multiple leads 30 to the microstrip 5 as shown. A single lead 30 would of course suffice, but with the plural leads as shown, the device will remain operative even if the neck 29 is open circuited.

A plurality of the switching devices shown in FIG. 1 are connected together to provide a switching matrix, one example of which is shown diagrammatically in FIG. 3. Six switching devices 31, 32, 33, 34, 35 and 36 are interconnected on two alumina substrates 37 and 38. Four input ports 41, 42, 43 and 44 can be interconnected in any combination to four output ports 45, 46, 47 and 48. The interconnecting links 49 consist of semirigid coaxial cable. In all a total of 24 combinations of input-output routes are possible although in practice by specifying a lesser number of combinations a degree of built-in redundancy is obtained. Thus, if a device partially fails, signals can be routed around the fault with no degradation of performance. A practical implementation is shown in FIG. 4 in which the two substrates are mounted back-to-back. In FIG. 4 the ground planes 51 and 52 are indicated. An air gap exists between the two ground planes.

This configuration results in a very compact and reliable high frequency switching matrix. For example, for a centre frequency of about 4 GHz the dimensions of the structure shown in FIG. 4 is no more than 6 inches long by 2 inches wide by 1 inch high.

What we claim is:

1. A switching device having four ports for routing very high frequency signals of center wavelength $\lambda$ in selectable routes between said ports in response to applied biasing signals, said device comprising a groundplane and four microstrips connected end-to-end to form a closed loop having four microstrip junctions; each of said microstrips being generally of uniform width but having at lengthwise intervals of $n\lambda/4$, $n$ being an odd integer, at least one portion reduced in width so as to form a narrow web of microstrip; each given microstrip having, for each of said at least one portions contained therein, a variable impedance PIN diode connecting each such web of said given microstrip to said groundplane, each given microstrip having a terminal means coupled thereto for applying said biasing signals, said PIN diodes being responsive to said biasing signal to assume a low-impedance state so as to provide an electrical shunt between said microstrip and said groundplane, whereby to prevent the passage of said very high frequency signals through said microstrip conductor, and said PIN diode being responsive to the absence of said biasing signals to assume a high impedance state so as to provide an open circuit between said microstrip and said groundplane, whereby to allow the passage of said very high frequency signals through said microstrip conductor.

2. A device as recited in claim 1 including an alumina substrate sandwiched between each of said microstrips and said groundplane, said substrate being discontinuous at points on said substrate corresponding to the location on said microstrip of said PIN diodes, whereby to permit said PIN electrically to couple said microstrip to said groundplane.

3. A switching arrangement comprising a plurality of switching devices as recited in claim 1, certain of the ports of said plurality of devices being connected together while the remaining ports define a set of input ports and a set of output ports to form a switching matrix having a plurality of selectable routes between said input and output ports.

4. A device as recited in claim 1 including four low pass filters, each of said filters being disposed in said terminal means.

* * * * *